(12) United States Patent
Seger

(10) Patent No.: US 9,576,997 B2
(45) Date of Patent: Feb. 21, 2017

(54) IMAGER MODULE FOR A CAMERA HAVING AN OPTICALLY TRANSPARENT, FLEXIBLE COUPLING ELEMENT AND MANUFACTURING METHOD FOR SUCH AN IMAGER MODULE

(71) Applicant: Robert Bosch GmbH, Stuttgart (DE)

(72) Inventor: Ulrich Seger, Leonberg-Warmbronn (DE)

(73) Assignee: ROBERT BOSCH GMBH, Stuttgart (DE)

( * ) Notice: Subject to any disclaimer, the term of this patent is extended or adjusted under 35 U.S.C. 154(b) by 89 days.

(21) Appl. No.: 14/522,100

(22) Filed: Oct. 23, 2014

(65) Prior Publication Data

US 2015/0115133 A1    Apr. 30, 2015

(30) Foreign Application Priority Data

Oct. 25, 2013   (DE) .................. 10 2013 221 704

(51) Int. Cl.
| | | |
|---|---|---|
| H01L 27/146 | (2006.01) | |
| G02B 7/04 | (2006.01) | |
| G03B 17/02 | (2006.01) | |
| B60R 11/04 | (2006.01) | |
| B60R 11/00 | (2006.01) | |

(52) U.S. Cl.
CPC ......... *H01L 27/14625* (2013.01); *B60R 11/04* (2013.01); *G02B 7/04* (2013.01); *G03B 17/02* (2013.01); *H01L 27/1469* (2013.01); *H01L 27/14685* (2013.01); *B60R 2011/0026* (2013.01); *Y10T 29/49002* (2015.01)

(58) Field of Classification Search
CPC ................... H01L 27/14625; H01L 27/14636; H04N 5/2253; H04N 5/2254; H04N 5/2257
USPC .............. 250/208.1, 239, 216; 348/373–376, 348/207–222; 257/432–436; 396/535, 421–428, 396/315
See application file for complete search history.

(56) References Cited

U.S. PATENT DOCUMENTS

| | | | | |
|---|---|---|---|---|
| 8,175,453 | B2 * | 5/2012 | Hase ................ | H04N 5/2171 396/535 |
| 2008/0079846 | A1 * | 4/2008 | Ikari ................ | G02B 27/0006 348/373 |

FOREIGN PATENT DOCUMENTS

DE   10 2011 075 701   11/2012

* cited by examiner

*Primary Examiner* — Que T Le
(74) *Attorney, Agent, or Firm* — Gerard Messina

(57) ABSTRACT

An imager module for a camera includes: a lens holder; a lens system which is accommodated in the lens holder and has a lens mount and at least one lens accommodated in the lens mount; and an image sensor; a rear lens area being formed between the image sensor and the at least one lens of the lens system; and an optically transparent, flexible coupling element provided in the rear lens area.

11 Claims, 3 Drawing Sheets

IMAGER MODULE FOR A CAMERA HAVING AN OPTICALLY TRANSPARENT, FLEXIBLE COUPLING ELEMENT AND MANUFACTURING METHOD FOR SUCH AN IMAGER MODULE

BACKGROUND OF THE INVENTION

1. Field of the Invention

The present invention relates to an imager module for a camera and to a manufacturing method for such an imager module.

2. Description of the Related Art

Published German patent application document DE 10 2011 075 701 A1 shows such an imager module and a camera including an imager module, which may be used in particular in a vehicle.

The imager module may be inserted as a complete unit in a camera housing to form a camera. For this purpose, the imager module includes a lens holder and a lens system which is accommodated in the lens holder and designed with a lens mount and one or multiple lenses. By longitudinally adjusting the lens system in the lens holder, focusing of an image sensor attached directly or indirectly to the lens holder may thus take place. In the automotive field, fixed focus cameras are generally formed, so that the lens system is fixed in a suitable longitudinal position in the lens holder. In this way, a rear lens area is formed between the image sensor or the sensitive surface of the image sensor and the rearmost lens surface of the lens system.

Dirt or condensation occurring in the rear lens area may impair the optical properties of the camera. For example, condensation may occur, in which condensation water condenses on the lens, or in particular also on the sensitive surface of the image sensor, for example. Moreover, soiling may occur. For example, particles may occur when the lens system is inserted into or attached to the lens holder, for example as particle abrasion between the outer side of the lens mount and the inner side of the lens holder. Such particles may deposit on the sensitive surface of the image sensor and considerably impair the optical properties.

BRIEF SUMMARY OF THE INVENTION

According to the present invention, a transparent, flexible coupling element is provided in the rear lens area between the at least one lens and the image sensor, in particular between the lens surface of the rearmost lens system and the sensitive surface of the image sensor. The transparent, soft coupling element is thus provided in the optical path around the optical axis.

The transparent, flexible coupling element may be made in particular of a liquid plastic material, in particular a partially cured, liquid plastic material. The coupling element advantageously has an outer area made of cured material and an inner area made of still liquid material. The material of the coupling element may in particular be a liquid silicone rubber (LSR) and is optically transparent in the relevant wavelength range.

The transparent, flexible coupling element may in particular directly adjoin a rearmost lens surface; moreover it may advantageously also directly adjoin the sensitive surface of the image sensor, i.e., completely fill the rear lens area at least in the relevant area of the optical path around the optical axis.

According to the present invention, several advantages are achieved:

As a result of the transparent, flexible coupling element, contamination, in particular condensation or particle contamination, of the sensitive surface of the image sensor and of the rearmost lens surface may be prevented or at least considerably limited. The contamination may in particular also be permanently prevented; additional sealing complexity may thus generally be kept lower than with conventional designs.

A further advantage is derived from optical properties of the transparent, flexible coupling element. The coupling element generally has a greater refractive index than air, so that it has a relevant impact on the optical properties of the imager module. The refractive index may thus be deliberately included in the design or the concept of the imager module, thus providing another degree of freedom in the configuration of the imager module. In this way, for example, the distance of the rear lens area may be suitably matched to the refractive index of the coupling element. Moreover, the shaping of the lenses may be matched to the refractive index of the coupling element, or the refractive index may be suitably selected so that suitable shapes of the lenses may be selected.

It is thus recognized that, in particular when very soft plastic material, such as LSR, is used, it is possible to completely fill the rear lens area, without the formation of disruptive air bubbles or air chambers, which may considerably limit the optical properties.

The imager module may be manufactured in various ways. In particular two alternative methods are advantageous for this purpose:

According to one embodiment, the lens system is initially inserted together with the lens mount and the lenses into a lens holder or into the camera, so that a rear lens area is formed; i.e., initially according to a conventional design of an imager module. Subsequently, the liquid plastic material is introduced into the rear lens area between the rearmost lens surface and the image sensor, in particular injected, i.e., introduced with the aid of an injection molding process. In this way, it completely fills the rear lens area, i.e., the area between the rearmost lens surface and the image sensor, at least in the optical passage area around the optical axis. The plastic material, and thus the coupling element formed thereby, may also fill in areas adjoining in the lateral direction. Advantageously at least one entrance aperture and at least one exit aperture are provided, for example, in the lens holder accommodating the lens system, which are sealed after the liquid material has been injected.

According to an alternative embodiment, the transparent, soft coupling element may initially be formed outside the imager module, so that it has at least one solid outer area or a solid outer skin, but advantageously is still liquid in an inner area. The coupling element is then introduced between the lens system and the image sensor during the formation of the imager module or the camera. In this way, for example, initially the coupling element is placed onto the image sensor and subsequently the lens system is placed on from the front, so that the rearmost lens surface ends up against the coupling element. Advantageously a low pressure is created in this process, i.e., slight bracing of the coupling element for secure contact. Entrance and exit apertures for an injection molding process are not required.

DETAILED DESCRIPTION OF THE INVENTION

Figure 1:
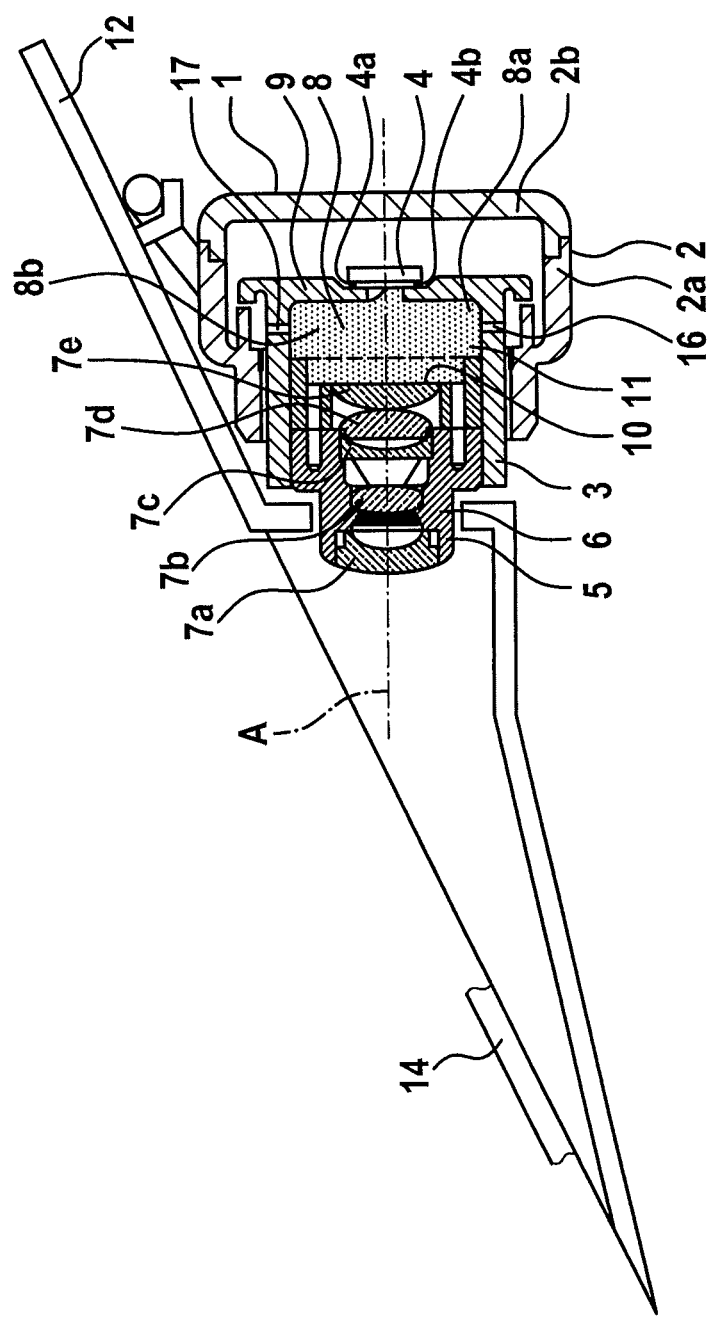
FIG. 1 shows a camera including an imager module according to one specific embodiment of the present invention.

A camera 1 includes a camera housing 2, an objective holder (lens holder) 3, an image sensor 4 attached to the rear side of lens holder 3, and a lens system 5 accommodated in lens holder 3. Lens system 5, in turn, includes a lens mount 6 and multiple lenses 7a, 7b, 7c, 7d, 7e. Lens mount 6 of lens system 5 is fixedly accommodated in lens holder 3; for manufacturing, lens system 5 is initially longitudinally adjustable in the direction of optical axis A and is subsequently fixed in lens holder 3, after a suitable longitudinal position has been ascertained, for example by detecting a test pattern at a relevant distance and evaluating the image signals of image sensor 4. In the configuration shown, image sensor 4 is accommodated at the rear side of lens holder 3 and contacted on lens holder 3; in particular a flip chip assembly may be formed, in which the contacting of image sensor 4 thus takes place on its front side laterally offset from its sensitive surface 4a. A recess 3a, on which sensitive surface 4a of image sensor 4 is positioned, is appropriately formed in lens holder 3.

A transparent, flexible coupling element 8 is provided between lens system 5 and image sensor 4. Coupling element 8 advantageously adjoins rearmost lens 7e; the rear side of lens 7e thus represents rearmost lens surface 10, which coupling element 8 directly adjoins. Moreover, coupling element 8 advantageously rests directly on sensitive surface 4a. In this way, between rearmost lens surface 10 and sensitive surface 4a of image sensor 4, no free interspace, or an interspace filled with air or protective gas, is provided any longer. Deviating from this specific embodiment, however, it is generally also possible for an interspace to be formed, for example between coupling element 8 and sensitive surface 4a.

Coupling element 8 is advantageously formed of a liquid silicone rubber (LSR). Coupling element 8 may be solid in an outer area for this purpose and, if necessary, still liquid in its inner area. Coupling element 8 is thus advantageously manufactured from a liquid silicone material. In particular, an outer skin 8a of coupling element 8 may be solid, and an inner area 8b, which is surrounded by outer skin or outer material 8a, may still be liquid.

Coupling element 8 is optically transparent in the wavelength range which is relevant for camera 1 or for image sensor 4. This wavelength range may in particular be visible light; if necessary, however, it may also be IR light with a camera 1 for night applications.

The LSR material of coupling element 8 may include in particular linear siloxanes, for example in a proportion of more than 50%, and moreover fillers and additives. It may have Shore hardness values in the range from 20 to 70. It is manufactured in particular as a two-component silicone material.

The entire camera 1 is accommodated by a camera mount 12, for example, and attached to a vehicle window 14 as a camera module.

Coupling element 8 has an optical refractive index n8, which is greater than refractive index n0 of air. Refractive index n8 may be selected in accordance with the design, in particular the distance between rear lens surface 10 and image sensor 4. In this way, the design or the optical arrangement of lenses 7a through 7e and of image sensor 4 and refractive index n8 of coupling element 8 may be matched to each other so that refractive index n8 forms a further degree of freedom in the design of camera 1 or of imager module 9.

Lens holder 3, together with image sensor 4 accommodated on its rear side and inserted lens system 5 as well as transparent, flexible coupling element 8, forms an imager module 9, which may be inserted as one unit into camera housing 2. The contacting of image sensor 4 takes place via its sensor contacts 4b, in particular its front side, for example with the aid of solder bumps 4b on conductors which are formed in lens holder 3. Such contactings are known per se.

Unlike lenses 7a through 7e, coupling element 8 is thus not accommodated by lens mount 6. It is situated between lens system 5 (camera optics) and image sensor 4. It may be placed under slight pressure in the direction of optical axis A or be introduced without pressure. Different manufacturing methods are provided for this purpose.

Figure 2:
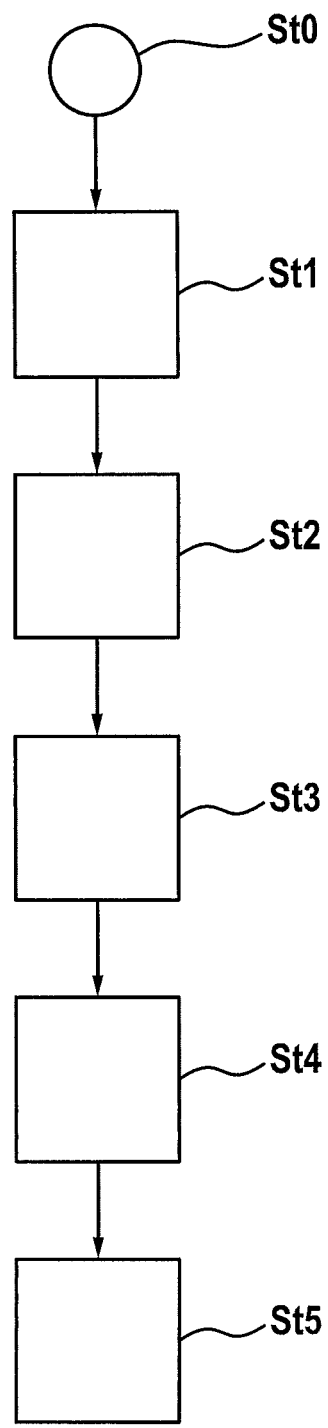
FIG. 2 shows a flow chart of a manufacturing method according to one specific embodiment.

According to the manufacturing method of FIG. 2, after the start in step St0, lens system 5 is initially formed in the conventional manner by inserting lenses 7a through 7e into lens mount 6 in step St1.

Moreover, image sensor 4 is attached to and contacted at the rear side of lens holder 3 in the manner known per se in step St2. Then, in step St3, lens system 5 is inserted from the front into essentially cup-shaped lens holder 3, i.e., it is introduced along optical axis A and, for example, also already fixed. Subsequently, in step St4, coupling element 8 is introduced into rear lens area 11 between rearmost lens surface 10 and sensitive surface 4a of image sensor 4 by injecting the LSR material. For this specific embodiment, at least one entrance aperture 16 for feeding the LSR material and at least one exit aperture 17 for excess LSR material are provided in lens holder 3, as is shown in dotted form. The LSR material thus cures and forms coupling element 8, whereupon entrance aperture 16 and exit aperture 17 or multiple such apertures are sealed in step St5.

Figure 3:
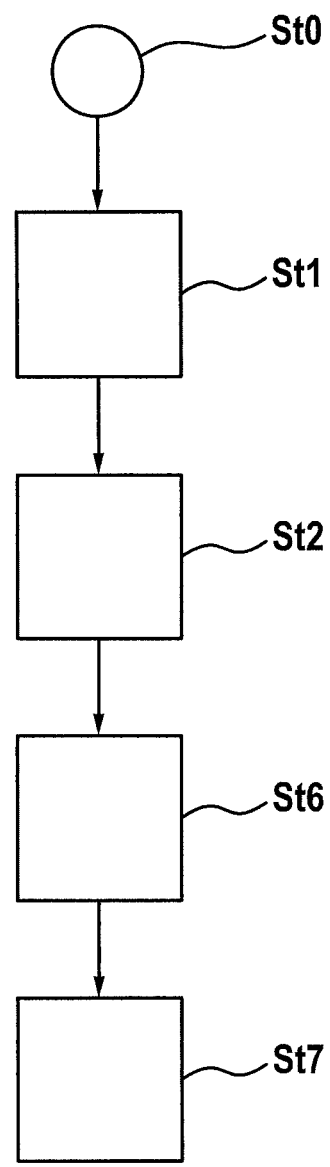
FIG. 3 shows a flow chart of a manufacturing method according to an alternative specific embodiment.

According to the alternative specific embodiment of FIG. 3, after the start in step St0, lens system 5 is formed once again in step St1 by inserting lenses 7a through 7e into lens mount 6. Moreover, image sensor 4 is also attached to and contacted at the rear side of lens holder 3 in step St2. Subsequently, in step St6, coupling element 8 is inserted into lens holder 3; coupling element 8 is cured sufficiently at least in its outer area 8a for it to be inserted as an element into lens holder 3. Subsequently, in step St7, lens system 5 is introduced from the front along optical axis A toward the rear until rearmost lens surface 10 ends up against coupling element 8; advantageously a pressure is exerted along optical axis A on coupling element 8, i.e., the same is braced slightly. In this specific embodiment, entrance aperture 16 and exit aperture 17 are thus not required.

What is claimed is:
1. An imager module for a camera, comprising:
a lens holder;
a lens system accommodated in the lens holder and having (i) a lens mount and (ii) at least one lens accommodated in the lens mount; and
an image sensor;
wherein a rear lens area is formed between the image sensor and the at least one lens of the lens system, wherein an optically transparent, flexible coupling element is provided in the rear lens area, and wherein the coupling element rests against a rearmost lens surface of the at least one lens of the lens system.

2. The imager module as recited in claim 1, wherein the coupling element rests against a sensitive surface of the image sensor.

3. The imager module as recited in claim 2, wherein the coupling element completely fills the rear lens area between the at least one lens and the sensitive surface of the image sensor, at least around an optical axis established by the lens system and the image sensor.

4. The imager module as recited in claim 3, wherein the coupling element includes at least one of a liquid silicone rubber material and liquid silicone plastic material which is cured in an outer area of the coupling element.

5. The imager module as recited in claim 4, wherein the coupling element has an inner area made of liquid material, and wherein the solid material of the outer area is formed by curing of the liquid material.

6. The imager module as recited in claim 4, further comprising:
    an entrance aperture adjoining the rear lens area for an injection process, wherein the coupling element is injected into the rear lens area through the entrance aperture.

7. The imager module as recited in claim 3, wherein the coupling element is accommodated under pressure between the at least one lens and the image sensor.

8. The imager module as recited in claim 7, wherein the imager module is part of a camera, and wherein the imager module is accommodated in a camera housing.

9. A method for manufacturing an imager module, comprising:
    forming a lens system including a lens mount and at least one lens accommodated in the lens mount;
    providing a lens holder including an image sensor;
    introducing the lens system into the lens holder to form a rear lens area between a rearmost lens surface of the at least one lens and the image sensor; and
    introducing a liquid material into the rear lens area and curing the liquid material to obtain a transparent, flexible coupling element between the rearmost lens surface and the image sensor.

10. A method for manufacturing an imager module, comprising:
    forming a lens system including a lens mount and at least one lens accommodated in the lens mount;
    providing a lens holder including an image sensor;
    introducing a transparent, flexible coupling element into the lens holder; and
    introducing the lens system into the lens holder and in contact with the coupling element such that the coupling element rests against a rearmost lens surface of the at least one lens of the lens system.

11. The imager module of claim 3, wherein no interspace is provided between the rearmost lens surface and the sensitive surface of the image sensor.

* * * * *